(12) United States Patent
Wang et al.

(10) Patent No.: US 9,490,760 B2
(45) Date of Patent: Nov. 8, 2016

(54) SELF-TIMED DIFFERENTIAL AMPLIFIER

(71) Applicant: CHINGIS TECHNOLOGY CORPORATION, Hsin-Chu (TW)

(72) Inventors: Mingshiang Wang, Hsin-Chu (TW); Ping-Chao Ho, Hsin-Chu (TW)

(73) Assignee: CHINGIS TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 14/591,082

(22) Filed: Jan. 7, 2015

(65) Prior Publication Data

US 2016/0156314 A1    Jun. 2, 2016

(30) Foreign Application Priority Data

Nov. 27, 2014   (TW) .............................. 103141228 A

(51) Int. Cl.
*G11C 7/06* (2006.01)
*H03F 3/45* (2006.01)

(52) U.S. Cl.
CPC ........... *H03F 3/45179* (2013.01); *G11C 7/062* (2013.01); *G11C 7/065* (2013.01); *H03F 2203/45018* (2013.01); *H03F 2203/45318* (2013.01)

(58) Field of Classification Search
CPC ...... G11C 7/062; G11C 7/065; G11C 11/412
USPC .................................................. 365/207, 154
See application file for complete search history.

(56) References Cited

U.S. PATENT DOCUMENTS

| | | | | |
|---|---|---|---|---|
| 5,042,011 A | * | 8/1991 | Casper ................ | G11C 11/4091 327/51 |
| 5,467,312 A | * | 11/1995 | Albon .................. | G11C 11/419 365/189.05 |
| 5,481,500 A | * | 1/1996 | Reohr ....................... | G11C 8/10 365/189.05 |
| 5,604,705 A | * | 2/1997 | Ackland ............... | G11C 11/419 365/190 |
| 5,615,169 A | * | 3/1997 | Leung ...................... | G11C 7/22 365/190 |
| 5,627,789 A | * | 5/1997 | Kalb, Jr. .................. | G11C 7/06 365/194 |
| 5,708,624 A | * | 1/1998 | Leung .................. | G11C 7/1072 365/189.011 |
| 5,964,884 A | * | 10/1999 | Partovi ............... | G06F 12/1054 711/167 |
| 5,982,203 A | * | 11/1999 | Pelella ................... | G11C 7/062 327/57 |
| 6,130,847 A | * | 10/2000 | Huang ..................... | G11C 7/22 365/194 |
| 6,473,349 B1 | * | 10/2002 | Flannagan ............. | G11C 7/065 365/205 |
| 7,038,963 B2 | * | 5/2006 | Lee ..................... | G11C 11/4091 365/189.09 |

(Continued)

OTHER PUBLICATIONS

Abu-Rahma, M.H.; Anis, M.; Sei Seung Yoon, "A robust single supply voltage SRAM read assist technique using selective precharge," in Solid-State Circuits Conference, 2008. ESSCIRC 2008. 34th European, vol., No., pp. 234-237, Sep. 15-19, 2008.*

*Primary Examiner* — Hoai V Ho
*Assistant Examiner* — Roberto Mancera
(74) *Attorney, Agent, or Firm* — Lin & Associates Intellectual Property, Inc.

(57) ABSTRACT

The present invention provides a self-timed differential amplifier, including an amplifier unit, having a pair of read/write terminals, wherein data is read or written by a select line; a pair of precharge transistors, controlled by a control line; and a pair of cross-coupled transistors, controlled by a column select line. Moreover, a complementary differential amplifier is formed by the combination of the pair of precharge transistors and the pair of cross-coupled transistors. The pair of the precharge transistors and the pair of cross-coupled transistors are connected to the pair of read/write terminals of the amplifier unit.

8 Claims, 3 Drawing Sheets

(56) References Cited

U.S. PATENT DOCUMENTS

| | | | |
|---|---|---|---|
| 7,865,747 B2* | 1/2011 | Buyuktosunoglu ... | G06F 1/3203 713/320 |
| 8,570,784 B2* | 10/2013 | Liu ................ | G11C 7/06 365/104 |
| 2002/0145932 A1* | 10/2002 | Nguyen ............ | G11C 7/22 365/227 |
| 2002/0181307 A1* | 12/2002 | Fifield ............ | G11C 7/062 365/208 |
| 2004/0100844 A1* | 5/2004 | Alvandpour ........ | G11C 7/12 365/208 |
| 2004/0202014 A1* | 10/2004 | Palmer ............ | G11C 11/419 365/154 |
| 2005/0117424 A1* | 6/2005 | Sung .............. | G11C 7/065 365/205 |
| 2005/0128854 A1* | 6/2005 | Winograd ......... | G06F 13/4086 365/230.03 |
| 2005/0180224 A1* | 8/2005 | Tzartzanis ........ | G11C 7/062 365/189.09 |
| 2009/0059686 A1* | 3/2009 | Sung .............. | G11C 7/08 365/189.11 |
| 2012/0134226 A1* | 5/2012 | Chow .............. | G11C 7/08 365/207 |
| 2012/0140575 A1* | 6/2012 | Pham .............. | G11C 7/04 365/189.07 |
| 2013/0258794 A1* | 10/2013 | Sharad ............ | G11C 7/08 365/205 |
| 2014/0204683 A1* | 7/2014 | Sahu .............. | G11C 7/065 365/189.05 |
| 2014/0355334 A1* | 12/2014 | Gotterba .......... | G11C 7/08 365/154 |
| 2014/0355362 A1* | 12/2014 | Wang .............. | G11C 7/1039 365/189.15 |

* cited by examiner

SELF-TIMED DIFFERENTIAL AMPLIFIER

CROSS-REFERENCES TO RELATED APPLICATION

This application claims the priority of Taiwanese patent application No. 103141228, filed on Nov. 27, 2014, which is incorporated herewith by reference.

BACKGROUND OF THE INVENTION

1. Field of the Invention

The present invention relates to a memory circuit, and more particularly, the present invention relates to a self-timed differential amplifier.

2. The Prior Arts

A memory circuit is a type of electronic device that is manufactured from semiconductor technologies, and is used for the storage of data. Data is stored in the memory circuit by means of a binary mode. Each storage unit of the memory is known as a memory cell.

A computer memory may be classified into volatile memory and non-volatile memory, in accordance with its storage ability and power source relationships. Volatile memory refers to the type of memory where data stored in the memory is lost subsequent to the interruption of power supply. There are two main types of volatile memory: dynamic random-access memory (DRAM) and static random-access memory (SRAM).

Moreover, non-volatile memory refers to the type of memory where the data stored within the memory will not be lost even after the interruption of power supply, and that once power supply is restored, the data stored in the memory may be read once again.

FIG. 1 is a schematic diagram showing a conventional memory circuit.

As shown in FIG. 1, the conventional memory includes an amplifier unit 5 and two transmission gates 7a, 7b. The two terminals of the two transmission gates 7a, 7b are respectively connected to the pair of read/write terminals and bit lines BL and BLB. The amplifier unit 5 may be made up of a plurality of transistors, and each of the transmission gates 7a, 7b is made up of the parallel connection of an n-type field-effect transistor and a p-type field-effect transistor. The two transmission gates 7a, 7b are controlled by the turn on/turn off timings of the column select line (CSL).

However, the efficiency and power consumption of the conventional memory circuit are limited by the turn on/turn off timings of the CSL. In other words, the turn on/turn off timings of the CSL need to be accurately controlled, otherwise the circuit efficiency will be reduced and power consumption will be increased.

As such, the problem of the conventional memory circuit needing to accurately control the turn on/turn off timings of the CSL and thus causing the power consumption of the memory circuit to be increased and reduced efficiency of the memory circuit are technical problems that need to be solved.

SUMMARY OF THE INVENTION

In light of the foregoing drawbacks of the prior art, an objective of the present invention is to solve the problems of reduced circuit efficiency and increased power consumption.

In order to achieve the foregoing objectives, the present invention provides a self-timed differential amplifier, which includes an amplifier unit that has a pair of read/write terminals, and data of the amplifier unit may be read or written by a select line; a pair of precharge transistors may be controlled by a control line; and a pair of cross-coupled transistors, controlled by a column select line, wherein a complementary differential amplifier may be formed by the combination of the pair of precharge transistors and the pair of cross-coupled transistors, and the pair of precharge transistors and the pair of cross-coupled transistors may be connected to the pair of read/write terminals of the amplifier unit.

Preferably, the amplifier unit may include one of a four-transistor structure and a six-transistor structure.

Preferably, each side of the pair of precharge transistors may include a first transistor. The first transistor may be a bipolar transistor or a field-effect transistor; and the first transistor may include a first terminal, a second terminal and a gate control terminal.

Preferably, the first terminal of the pair of precharge transistors may be connected to a ground or a power supply.

Preferably, each side of the pair of cross-coupled transistors may include a cascode configuration of a second transistor and a third transistor. The second transistor and the third transistor may be bipolar transistors or field-effect transistors; and the second transistors and the third transistor may include a first terminal, a second terminal and a gate control terminal.

Preferably, the gate control terminal of the second transistor on the first side of the pair of cross-coupled transistors may be connected to the first terminal of the second transistor on the second side of the pair of cross-coupled transistors and one of the pair of read/write terminals of the amplifier unit; and the gate control terminal of the second transistor on the second side of the pair of cross-coupled transistors may be connected to the first terminal of the second transistor on the first side of the pair of cross-coupled transistors and another of the pair of read/write terminals.

Preferably, the second terminal of the second transistor of the pair of cross-coupled transistors may be connected to the second terminal of the third transistor of the pair of cross-coupled transistors.

Preferably, the first terminals of the third transistors on the first side and the second side of the pair of cross-coupled transistors may be connected to bit lines BL and BLB.

Preferably, the first terminal and the second terminal of the first transistor of the pair of the precharge transistors may be interchangeable, and the first transistor of the pair of the precharge transistors may be a p-type transistor or an n-type transistor.

Preferably, the first terminal and the second terminal of the second transistor and the third transistor of the pair of cross-coupled transistors may be interchangeable, and the second transistor and the third transistor of the pair of cross-coupled transistors may be a p-type transistor or an n-type transistor.

In comparison to the prior art, the present invention may enhance the efficiency of the memory circuit without the need to accurately provide a column select line with turned on or turned off timing. In addition, during the period when the column select line is timed on or off, the power consumption of the memory circuit itself may be reduced. As such, the self-timed differential amplifier of the present invention has the benefits of reducing the design costs, reducing power consumption as well as enhancing the efficiency of the memory circuit.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate preferred exemplary embodiments of the invention and, together with the description, serve to explain the principles of the invention.

The following embodiments of the present invention describe a memory circuit having a self-timed differential amplifier.

Figure 1:
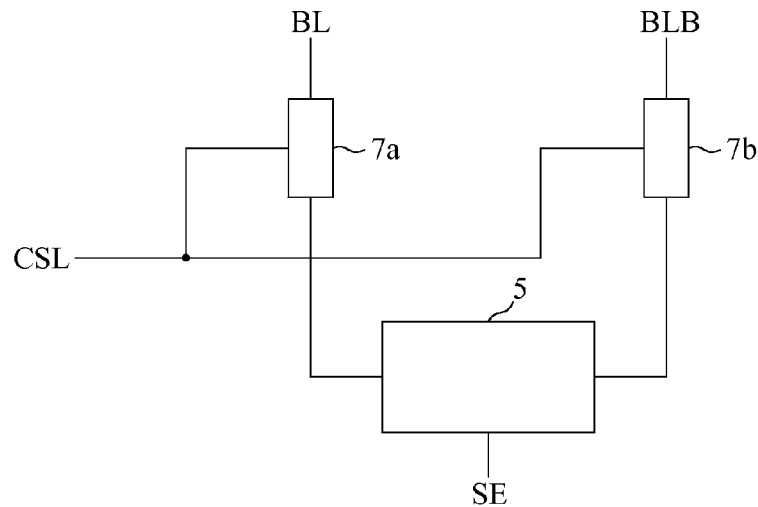
FIG. 1 is a schematic diagram showing a conventional memory circuit.
Figure 2:
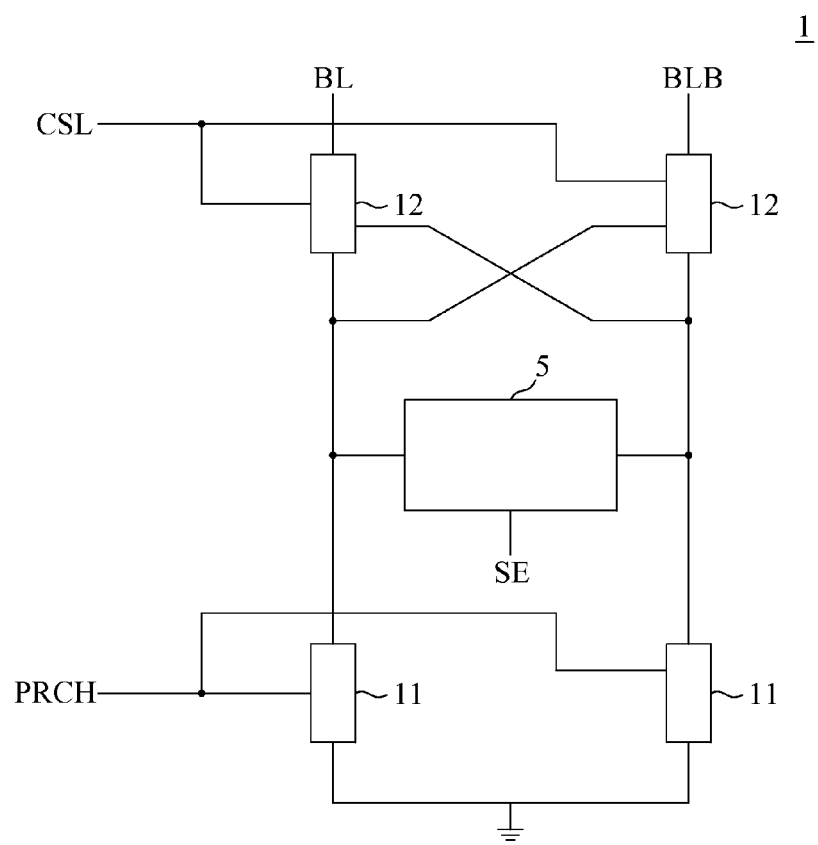
FIG. 2 is a schematic diagram showing a self-timed differential amplifier of the present invention.

FIG. 2 is a schematic diagram showing the self-timed differential amplifier 1 of the present invention.

In accordance with a preferred embodiment of the present invention, and as shown in FIG. 2, the present invention provides a self-timed differential amplifier 1, which includes an amplifier unit 5, and also includes a pair of read/write terminals. The self-timed differential amplifier reads or writes data by means of a select line SE. A pair of precharge transistors 11 may be controlled by the control line PRCH. The pair of cross-coupled transistors 12 may be controlled by the column select line CSL, whereby a complementary differential amplifier may be formed by the combination of the pair of precharge transistors 11 and the pair of cross-coupled transistors 12; and the complimentary differential amplifier may be connected to a pair of read/write terminals of the amplifier unit 5.

In accordance with a preferred embodiment of the present invention, the amplifier unit 5 may be one of a four-transistor structure and a six-transistor structure (not shown in the Figs.), but may not be limited to these.

As shown in FIG. 2, each side of the pair of precharge transistors 11 may be made up of a first transistor. The transistor may be one of a bipolar transistor or a field effect transistor; the transistor may include a first terminal, a second terminal and a gate control terminal.

In accordance with a preferred embodiment of the present invention, the first terminal of the pair of precharge transistors 11 may be connected to a ground or a power supply.

In addition, as shown in FIG. 2, each side of the pair of cross-coupled transistors 12 may be connected to two transistors (not shown). The two transistors may be one of a bipolar transistor or a field-effect transistor, but may not be limited to these. Furthermore, each of the two transistors has a first terminal, a second terminal and a gate control terminal.

According to a preferred embodiment of the present invention, the gate control terminal of a second transistor on a first side of the pair of cross-coupled transistors 12 may be connected to the first terminal of the second transistor on a second side of the pair of cross-coupled transistors and one of a pair of read/write terminals of the amplifier unit. Moreover, the gate control terminal of the second transistor on the second side of the pair of cross-coupled transistors 12 may be connected to the first terminal of the second transistor on the first side of the pair of cross-coupled transistors 12 and another of the pair of read/write terminals of the amplifier unit.

According to a preferred embodiment of the present invention, the other end of the two sides of the pair of cross-coupled amplifier 12 may be respectively connected to the bit lines BL and BLB.

In accordance with a preferred embodiment of the present invention, the first terminal and the second terminal of the transistors of the pair of precharge transistors 11 and the pair of the cross-coupled transistors 12 may be interchangeable.

In addition, in accordance with a preferred embodiment of the present invention, the first terminal and the second terminal of the transistor of the pair of the precharge transistors 11 and the pair of the cross-coupled transistors 12 may be an emitter or a collector. Or, the first terminal and the second terminal of the transistor of the pair of the cross-coupled transistors 12 may be a source electrode or a drain electrode.

According to a preferred embodiment of the present invention, the transistor of the pair of the precharge transistors 11 and the pair of the cross-coupled transistor 12 may be a p-type transistor or an n-type transistor.

Figure 3:
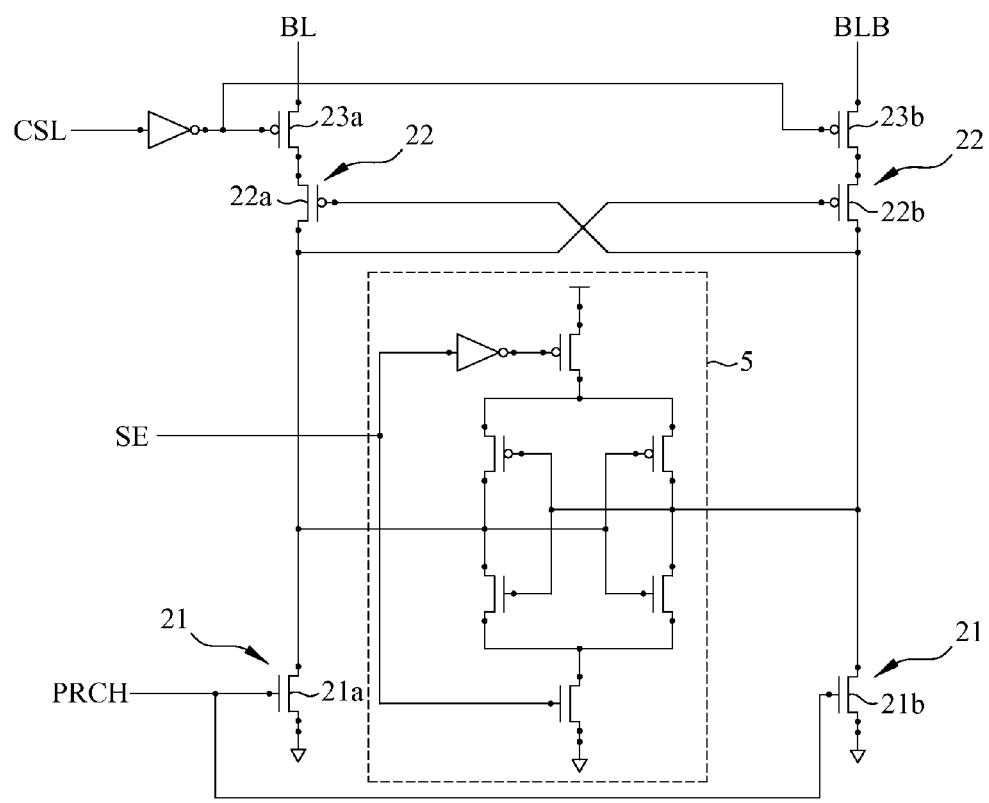
FIG. 3 is a schematic circuit diagram showing the self-timed differential amplifier according to the first embodiment of the present invention.

FIG. 3 is a schematic circuit diagram showing the self-timed differential amplifier according to the first embodiment of the present invention.

In accordance to the first preferred embodiment of the present invention, as shown in FIG. 3, the present invention provides a self-timed differential amplifier 1 that includes an amplifier unit 5; the amplifier unit 5 may include a read/write terminal. The reading or writing of data by the amplifier unit may be achieved by means of a select line SE. The pair of precharge transistors 21 may be controlled by a control line; and the pair of cross-coupled transistors 22 may be controlled by a column select line CSL, whereby a complementary differential amplifier may be formed by the combination of the pair of precharge transistors 21 and the pair of cross-coupled transistors 22. Furthermore, the complementary differential amplifier may be connected to the amplifier unit 5 via the read/write terminals.

As shown in FIG. 3, according to the first preferred embodiment of the present invention, the pair of precharge transistors 21 may be made up of n-type transistors, and the pair of cross-coupled transistors may be made up of p-type transistors.

In accordance with the first preferred embodiment of the present invention, as shown in FIG. 3, the amplifier unit 5 may be one of a four-transistor structure or a six-transistor structure, but may not be limited to these.

As shown in FIG. 3, the two sides of the pair of precharge transistors 21 may be made up of first transistors 21a, 21b. The first transistors 21a, 21b may be one of a bipolar transistor or a field-effect transistor, and the first transistors 21a, 21b has a first terminal, a second terminal and a gate control terminal.

According to the first preferred embodiment of the present invention, the first terminal of the pair of precharge transistors may be connected to one of a ground or power supply.

Moreover, as shown in FIG. 3, the two sides of the pair of cross-coupled transistors 22 may be made up of a cascode configuration of the second transistors 22a, 22b and the third transistor 23a, 23b, respectively. The second transistors 22a, 22b and the third transistors 23a, 23b may be one of a bipolar transistor or a field-effect transistor. In addition, the second transistors 22a, 22b and the third transistors 23a, 23b may have a first terminal, a second terminal and a gate control terminal, but may not be limited to these.

According to the first preferred embodiment of the present invention, the gate control terminal of the second transistor 22a on the first side of the pair of cross-coupled transistors 22 may be connected to the first terminal of the second transistor 22b on the second side of the pair of cross-coupled transistors 22 and one of the pair of read/write terminals of the amplifier unit 5. Moreover, the gate control terminal of the second transistor 22b on the second side of the pair of cross-coupled transistors 22 may be connected to the first terminal of the second transistor 22a on the first side of the pair of cross-coupled transistors 22 and another of the pair of read/write terminals of the amplifier unit 5.

As shown in FIG. 3, the second terminal of the second transistors 22a, 22b of the pair of the cross-coupled transistors 22 may be connected to the second terminal of the third transistors 23a, 23b of the pair of the cross-coupled transistors 22 in the cascode configuration.

In accordance with the first preferred embodiment of the present invention, the first terminal of the third transistors 23a, 23b on the first side and second side of the pair of the cross-coupled transistors 22 may be respectively connected to the bit lines BL and BLB.

In accordance with the first preferred embodiment of the present invention, the first terminal and the second terminal of the first transistors 21a, 21b, the second transistors 22a, 22b and the third transistors 23a, 23b may be interchangeable.

Additionally, in accordance with the first preferred embodiment of the present invention, the first terminal and the second terminal of the first transistors 21a, 21b, the second transistors 22a, 22b and the third transistors 23a, 23b may be an emitter or a collector. Furthermore, the first terminal and second terminal of the first transistors 21a, 21b, the second transistors 22a, 22b and the third transistors 23a, 23b may be a source electrode or a drain electrode.

Figure 4:
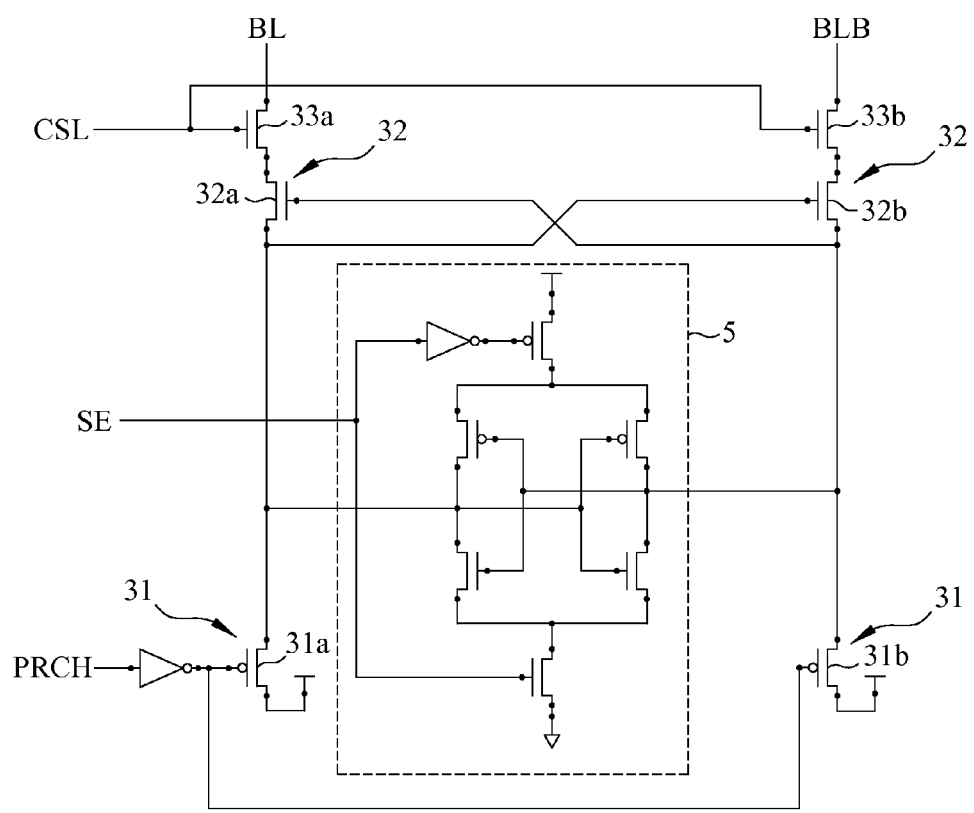
FIG. 4 is a schematic circuit diagram showing the self-timed differential amplifier according to the second embodiment of the present invention.

FIG. 4 is a schematic circuit diagram showing the self-timed differential amplifier according to the second embodiment of the present invention.

According to the second preferred embodiment of the present invention, as shown in FIG. 4, the present invention also provides a self-timed differential amplifier 1, which includes an amplifier unit 5, and having a read/write terminal. The reading or writing of data by the amplifier unit 5 may be achieved by means of a select line SE. The pair of precharge transistor 31 may be controlled by the control line PRCH. Furthermore, the pair of cross-coupled transistors 32 may be controlled by the column select line CSL, wherein a complementary differential amplifier may be formed by the combination of the pair of precharge transistors 31 and the pair of cross-coupled transistors 32; and the complimentary differential amplifier may be connected to a pair of read/write terminals of the amplifier unit 5.

In accordance with the second preferred embodiment of the present invention, as shown in FIG. 4, the pair of the precharge transistors 31 may be made up of a p-type transistor, and the pair of the cross-coupled transistors 32 may be made up of an n-type transistor.

In accordance with the second preferred embodiment of the present invention, the amplifier unit 5 may be one of a four-transistor structure or a six-transistor structure, but may not be limited to these.

As shown in FIG. 4, the two sides of the pair of precharge transistors 31 may be made up of the first transistors 31a, 31b. The first transistors 31a, 31b may be one of a bipolar transistor or a field-effect transistor. Furthermore, the first transistors 31a, 31b may have a first terminal, a second terminal and a gate control terminal.

In accordance with the second preferred embodiment of the present invention, the first terminal of the pair of precharge transistors may be connected to one of a ground or a power supply.

Referring to FIG. 4, the two sides of the pair of cross-coupled transistors 32 may be made up of a cascode configuration of the second transistors 32a, 32b and third transistors 33a, 33b. The second transistors 32a, 32b and the third transistors 33a, 33b may be one of a bipolar transistor and a field-effect transistor. Moreover, the second transistors 32a, 32b and the third transistors 33a, 33b may have a first terminal, a second terminal as well as a gate control terminal, but may not be limited to these.

According to the second preferred embodiment of the present invention, the gate control terminal of the second transistor 32a on the first side of the pair of cross-coupled transistors 32 may be connected to the first terminal of the second transistor 32b on the second side of the pair of cross-coupled transistors 32 and one of the pair of read/write terminals of the amplifier unit 5. Moreover, the gate control terminal of the second transistor 32b on the second side of the pair of the cross-coupled transistors 32 may be connected to the first terminal of the second transistor 32a on the first side of the pair of cross-coupled transistors 32 and one of the pair of read/write terminals of the amplifier unit 5.

As shown in FIG. 4, a cascode configuration of the second terminal of the second transistors 32a, 32b of the pair of the cross-coupled transistors 32 and the second terminal of the third transistors 33a, 33b of the pair of the cross-coupled transistors 32 may be provided.

According to the second preferred embodiment of the present invention, the first terminal of the third transistors 33a, 33b on the first side and the second side of the pair of the cross-coupled transistors 32 may be respectively connected to the bit lines BL and BLB.

Referring to FIG. 4, the first terminal and the second terminal of the first transistors 31a, 31b, second transistors 32a, 32b and the third transistors 33a, 33b may be interchangeable.

In addition, in the second preferred embodiment of the present invention, the first terminal and the second terminal of the first transistors 31a, 31b, the second transistors 32a, 32b and the third transistors 33a, 33b may be an emitter or a collector. Moreover, the first terminal and the second terminal of the first transistors 31a, 31b, the second transistors 32a, 32b and the third transistors 33a, 33b may be a source electrode or a drain electrode.

By means of using a complimentary differential amplifier and an amplifier unit 5, the self-timed differential amplifier of the present invention solves the problem of the prior art. In particular, the present invention solves the problem of needing to accurately control the turned on and turned off timing of the column select line CSL. In addition, the self-timed differential amplifier of the present invention may also effectively decrease the power consumption of the memory circuit, and also enhances the efficiency of the memory circuit.

The above preferred embodiments describe the principle and effect of the present invention, but are not limited to the present invention. It will be apparent to a person ordinarily skilled in the art that various modifications and variations can be made to the disclosed embodiments. It is intended that the specification and examples be considered as exemplary embodiment only, with a true scope of the disclosure being indicated by the following claims and their equivalents.

Although the present invention has been described with reference to the preferred exemplary embodiments thereof, it is apparent to those skilled in the art that a variety of modifications and changes may be made without departing from the scope of the present invention which is intended to be defined by the appended claims.

What is claimed is:

1. A self-timed differential amplifier, comprising:
   an amplifier unit, having a pair of read/write terminals, wherein data is read or written by a select line, the amplifier unit comprising a transistor structure having at least two pairs of transistors with one pair controlled by the select line and the other pair controlled by an inverted signal of the select line;
   a pair of precharge transistors, controlled by a control line, each side of the pair of precharge transistors including a first transistor, the first transistor being a bipolar transistor or a field-effect transistor, and the first transistor having a first terminal, a second terminal and a gate control terminal; and
   a pair of cross-coupled transistors, controlled by a column select line, each side of the pair of cross-coupled transistors including a cascode configuration of a second transistor and a third transistor, the second and third transistors being bipolar transistors or field-effect transistors, and each of the second and third transistors having a first terminal, a second terminal and a gate control terminal;
   wherein the pair of precharge transistors and the pair of cross-coupled transistors are connected to the pair of read/write terminals of the amplifier unit, and the gate control terminals of the third transistors in each side of the pair of cross-coupled transistors are connected to the column select line.

2. The self-timed differential amplifier according to claim 1, wherein the transistor structure of the amplifier unit comprises a six-transistor structure.

3. The self-timed differential amplifier according to claim 1, wherein the first terminal of the pair of precharge transistors is connected to a ground or a power supply.

4. The self-timed differential amplifier according to claim 1, wherein the gate control terminal of the second transistor on a first side of the pair of cross-coupled transistors is connected to the first terminal of the second transistor on a second side of the pair of cross-coupled transistors and one of the pair of read/write terminals of the amplifier unit, and the gate control terminal of the second transistor on the second side of the pair of cross-coupled transistors is connected to the first terminal of the second transistor on the first side of the pair of cross-coupled transistors and the other of the pair of read/write terminals of the amplifier unit.

5. The self-timed differential amplifier according to claim 1, wherein the second terminal of the second transistor is connected to the second terminal of the third transistor in each side of the pair of cross-coupled transistors.

6. The self-timed differential amplifier according to claim 4, wherein the first terminals of the third transistors on the first side and the second side of the pair of cross-coupled transistors are connected to bit lines BL and BLB.

7. The self-timed differential amplifier according to claim 1, wherein the first terminal and the second terminal of the first transistor in each side of the pair of the precharge transistors are interchangeable, and the first transistor in each side of the pair of the precharge transistors is a p-type transistor or an n-type transistor.

8. The self-timed differential amplifier according to claim 1, wherein the first terminal and the second terminal of the second transistor and the third transistor in each side of the pair of cross-coupled transistors are interchangeable, and the second transistor and the third transistor in each side of the pair of cross-coupled transistors are a p-type transistor or an n-type transistor.

* * * * *